United States Patent
Zimmermann et al.

(10) Patent No.: US 7,372,719 B2
(45) Date of Patent: May 13, 2008

(54) DRAM SEMICONDUCTOR MEMORY DEVICE WITH INCREASED READING ACCURACY

(75) Inventors: Ulrich Zimmermann, Ottendorf-Okrilla (DE); Ralf Gerber, Dresden (DE)

(73) Assignee: Qimonda AG, Munich (DE)

(*) Notice: Subject to any disclaimer, the term of this patent is extended or adjusted under 35 U.S.C. 154(b) by 17 days.

(21) Appl. No.: 11/552,252

(22) Filed: Oct. 24, 2006

(65) Prior Publication Data

US 2007/0091709 A1  Apr. 26, 2007

(30) Foreign Application Priority Data

Oct. 24, 2005  (DE) .................... 10 2005 050 811

(51) Int. Cl.
*G11C 11/24* (2006.01)
(52) U.S. Cl. .................... 365/149; 365/203; 365/210
(58) Field of Classification Search .............. 365/204
See application file for complete search history.

(56) References Cited

U.S. PATENT DOCUMENTS 5,062,079 A * 10/1991 Tsuchida et al. ............ 365/210
5,982,695 A * 11/1999 Mukai ....................... 365/226
6,738,282 B2 * 5/2004 Jo ............................. 365/149
6,928,012 B2   8/2005 Camacho et al.

* cited by examiner

*Primary Examiner*—Tan T. Nguyen
(74) *Attorney, Agent, or Firm*—Edell, Shapiro & Finnan, LLC

(57) ABSTRACT

A DRAM semiconductor memory device with increased reading accuracy and a method for increasing the reading accuracy of a DRAM memory cell are provided. First and second bit lines are connected to a sense amplifier and are connected in each case to a further memory cell. The gates of the further memory cells are driven via a driving circuit device. An equalization voltage of the two bit lines is influenced in the event of a precharge operation, and a capacitive disequilibrium is avoided at inputs of a sense amplifier due to the voltages on the bit lines in the event of reading the memory cell.

21 Claims, 3 Drawing Sheets

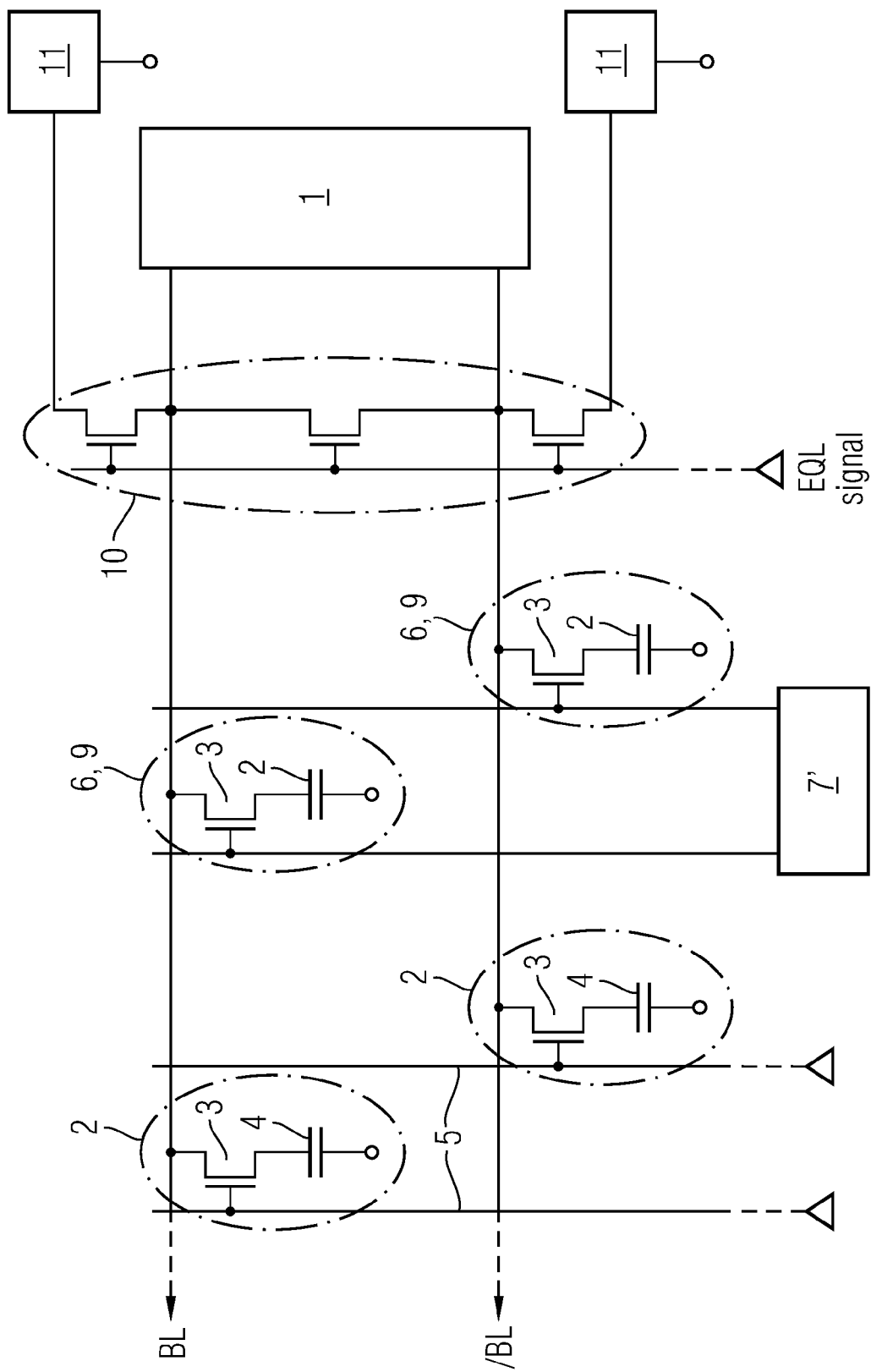

DRAM SEMICONDUCTOR MEMORY DEVICE WITH INCREASED READING ACCURACY

CROSS REFERENCE TO RELATED APPLICATIONS

This application claims priority under 35 U.S.C. §119 to Application No. DE 102005050811.1 filed on Oct. 24, 2006, entitled "DRAM Semiconductor Memory Device with Increased Reading Accuracy," the entire contents of which are hereby incorporated by reference.

BACKGROUND

DRAMs (dynamic random access memory) serve for storing and reading items of information. They have memory cells arranged in matrix form in a memory cell array and each comprising a selection transistor and a storage capacitor. In this case, an item of digital information, i.e., a "0" or a "1," is defined via a charge on the storage capacitor. In order to change the charge state of a memory cell, the memory cells arranged in matrix form are connected to bit lines via a drain of the selection transistor, gates of the selection transistors being able to be driven via word lines running perpendicular with respect to the bit lines. A specific memory cell can thus be driven individually via the bit line and word line of the selection transistor. By switching on the gate of the selection transistor, charge can either be stored on the storage capacitor via the bit line or else be read out from the storage capacitor via the bit line. A sense amplifier is used for reading purposes, two bit lines BL and /BL being connected to the sense amplifier. Before a read operation, the two bit lines BL and /BL are precharged to a voltage VBLEQ, the voltage VBLEQ, as is known, corresponding to half of a bit line high voltage level value VBLH, VBLH representing the voltage of a bit line for writing a "1" to a memory cell. If the two bit lines BL and /BL are at the voltage VBLEQ, then the gate of the selection transistor of the memory cell to be read is opened, and the potential of that one of the two bit lines BL and /BL to which the memory cell to be read is connected changes. The potential change on the corresponding bit line relative to the potential VBLEQ on the other bit line is amplified by the sense amplifier and represents the read signal. In this case, the read signal depends on the voltage difference between a high ("1") and low ("0") level of the storage capacitor, the capacitance of the storage capacitor and also a parasitic capacitance of the bit line including the input capacitance of the sense amplifier.

The probability of correctly identifying a "0" and "1" memory state of a memory cell depends for example on leakage currents or the bias voltage of the sense amplifier. Shifting the VBLEQ level on the bit lines to values that are different from VBLH/2 during a precharge operation would on average increase the probability of correctly detecting the memory state of the memory cell and thus lead to an increase in the reading accuracy. A corresponding change in the output voltage of a VBLEQ voltage source to which the bit lines BL and /BL are connected in the precharge state does not achieve the desired success, however, as is explained below. During the precharging of the bit lines after a memory cell access, the bit lines BL and /BL connected to the sense amplifier are short-circuited with one another. Since one of these bit lines is at 0 V, i.e., low level, and the other is at VBLH, i.e., high level, and both bit lines have the same capacitance, a potential value of VBLH/2 is established as a result of capacitive charge reversal on the two bit lines. Since the connection of the bit lines to VBLEQ voltage sources usually leads via a very large resistance in order, for example, to limit leakage currents in the case of short circuits between word and bit lines, the voltage established as a result of the short-circuiting of the two bit lines is dominant over the output voltage provided by the VBLEQ voltage source. This prevents the precharge voltage of the bit lines from being changed to values that are different from VBLH/2 by simply changing the output voltage of a VBLEQ voltage source.

When the gate of the selection transistor is opened during a read operation and the storage node of a DRAM cell is thus connected to one of the bit lines, the effective capacitance of the bit line increases. In the case of the cross-coupled differential sense amplifiers that are usually used in DRAM semiconductor memory devices, this results in impairment of the reading accuracy on account of the capacitive disequilibrium. Such impairments of the reading accuracy adversely affect the yield of the DRAMs.

SUMMARY

A DRAM semiconductor memory device with increased reading accuracy is described below. A method for increasing the reading accuracy of a DRAM memory cell is also described below. A DRAM semiconductor memory device with increased reading accuracy includes bit lines BL and /BL connected to a sense amplifier in each case a further memory cell. The gates of the further memory cells are driven via a driving circuit device. Thereby, an equalization voltage VBLEQ of the two bit lines BL and /BL may be influenced during a precharge operation and also a capacitive disequilibrium at inputs of a sense amplifier may be avoided on account of the loads on the bit lines BL and /BL during the reading.

The above and still further features and advantages will become apparent upon consideration of the following definitions, descriptions and descriptive figures of specific embodiments thereof, wherein like reference numerals in the various figures are utilized to designate like components. While these descriptions go into specific details of the device and method described herein, it should be understood that variations may and do exist and would be apparent to those skilled in the art based on the descriptions herein.

BRIEF DESCRIPTION OF THE DRAWINGS

FIG. 3 illustrates a second embodiment of a DRAM with a high reading accuracy.

DETAILED DESCRIPTION

Figure 1:
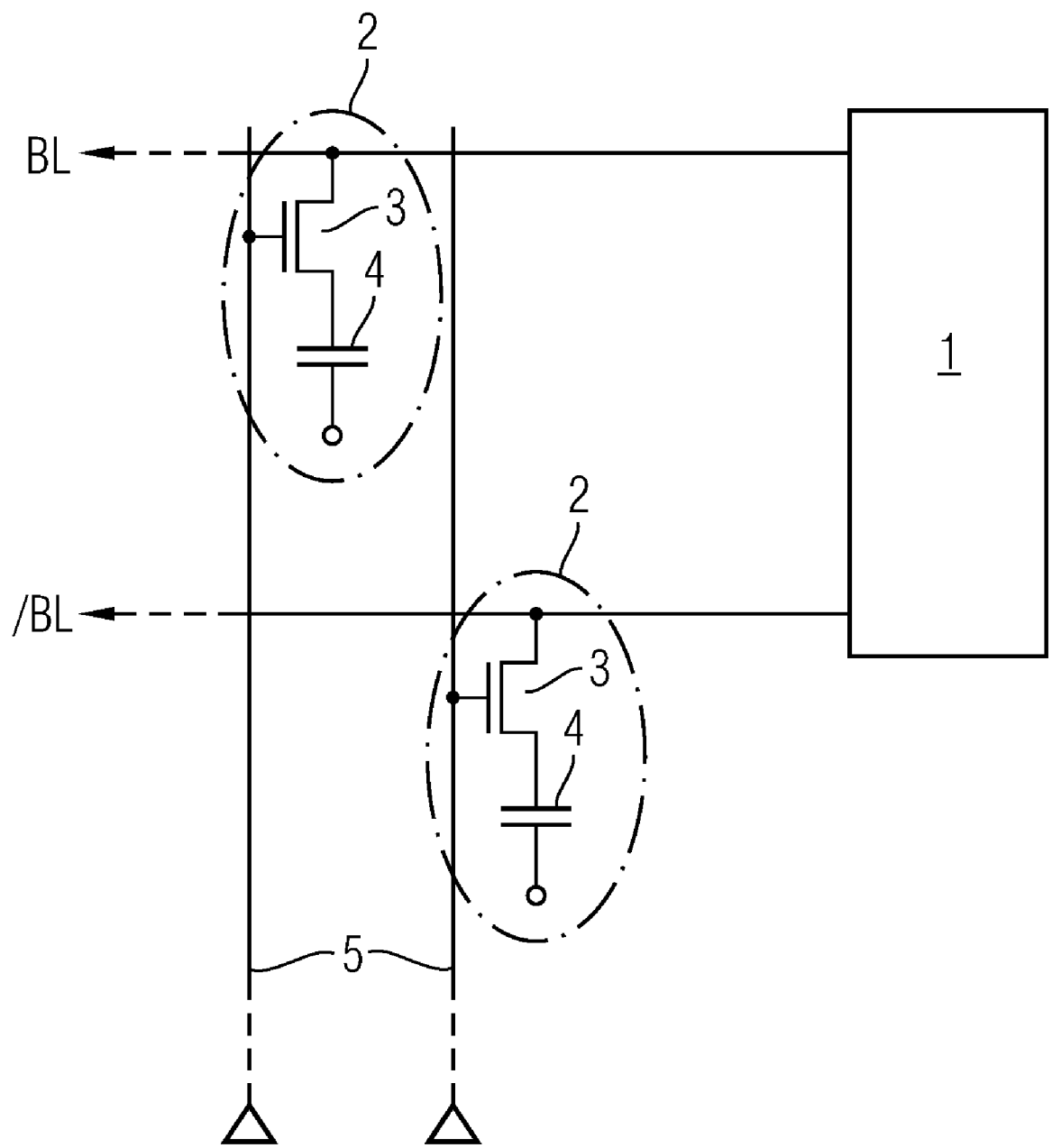
FIG. 1 shows a known arrangement of a DRAM for reading out the charge of a memory cell.

A DRAM semiconductor memory device with increased reading accuracy and a method for increasing the reading accuracy are described below, where the above-noted problems when reading the information state of a memory cell are avoided using the device and method.

A DRAM semiconductor memory device including memory cells is provided. The memory cells in each case comprise a selection transistor and a storage capacitor and are arranged along bit lines running parallel to one another and word lines running perpendicular thereto in a memory cell array, drain regions of the selection transistors connected to the bit lines, and gates of the selection transistors connected to the word lines, in each case a pair of bit lines BL and /BL being connected to a sense amplifier. The DRAM semiconductor memory device in each case includes a further memory cell connected to the bit lines BL and /BL, and a driving circuit device, the gates of the two further memory cells being able to be switched on simultaneously via the driving circuit device at the beginning of a precharge operation for charging the bit lines BL and /BL to an equalization voltage VBLEQ.

The selection transistor may be an n-channel MOSFET (metal oxide semiconductor field effect transistor), for example, the source of which is connected to an electrode of the storage capacitor. The current flow required for charging and discharging the storage capacitor is controlled by changing a conductivity of a channel region lying between source and drain. The gate connected to the word line may be used for this purpose. In the event that the gate is switched on, charge can flow away from and to the storage capacitor. If the gate of the selection transistor is switched off, then no charge can flow away or in between source and drain via the bit line and the charge state of the storage capacitor changes merely as a result of charges flowing away as a consequence of undesirable leakage currents. During the precharge operation prior to the actual reading of the memory cell via switching on the gate of the selection transistor of the memory cell to be read, the associated bit line pair BL and /BL is brought to a common equalization voltage VBLEQ. During this potential equalization operation, the driving circuit device then serves to ensure that not only are parasitic capacitances of the bit lines subjected to charge reversal to the equalization voltage VBLEQ, but in addition the storage capacitors of the further memory cells also contribute to the charge equalization. For this purpose, the storage capacitors of the further memory cells may be conductively connected to the bit lines via the associated further selection transistors during the precharge operation via the gates thereof, which are switched on via the driving circuit device, and the storage capacitors thus contribute to the charge equalization between the bit lines BL and /BL to the equalization voltage VBLEQ.

During a read operation of a memory cell connected to one bit line of the pair BL and /BL, the gate of that further memory cell that is connected to the other bit line of the pair BL and /BL can be switched on via the driving circuit device in compliance with a further embodiment. The relevant further memory cell is preferably switched on at the beginning of the read operation, while the other one of the two memory cells remains switched off. Consequently, during the reading of a memory cell connected to a bit line of the pair BL and /BL, the gate of the selection transistor of this memory cell to be read is switched on, such that a capacitive charge reversal occurs between the storage capacitor of the memory cell to be read and the bit line connected thereto. The other bit line of the pair BL and /BL, which does not participate in this charge-reversal operation, is likewise conductively connected to a storage capacitor, however, via the driving circuit device turning on the gate of the selection transistor of the further memory cell connected to the other bit line. Since the storage capacitor of the further memory cell is charged to the equalization voltage VBLEQ in the same way as the other bit line, connecting in the further memory cell in this way has no effect on the potential of the other bit line. However, the two bit lines BL and /BL are capacitively coupled to a switched-on memory cell during the read operation. The further memory cell thus establishes a balance between the total parasitic capacitances of the bit lines BL and /BL during the read operation and the further memory cells thus serve as capacitive equalization cells. The further memory cell which is connected to the same bit line as the memory cell to be read is switched off during the read operation, i.e., that the gate of the selection transistor of the memory cell is kept in a switched-off state via the driving circuit device.

In a further embodiment, a bit line equalization circuit device serves for connecting a VBLEQ voltage source, which can be set in terms of its output voltage, to the bit lines BL and /BL and for short-circuiting the bit lines during the precharge operation, a resistance of the connection between the VBLEQ voltage source and the bit lines BL and /BL being a plurality of orders of magnitude greater than the resistance between the short-circuited pair of bit lines BL and /BL. As a consequence of this, the potential of the bit lines BL and /BL during the precharge operation is set essentially via capacitive charge-reversal operations between the bit lines BL and /BL and to a lesser extent by the predefinition via the VBLEQ voltage source. Furthermore, if the output voltage of the VBLEQ voltage source matches the potential that is established capacitively on the bit lines BL and /BL, then no potential change caused by the VBLEQ voltage source would occur on the bit lines BL and /BL even if the precharge operation were extended temporally.

As a further embodiment, the VBLEQ voltage source includes laser fuses for setting its output voltage. In the case of laser fuses of this type, lines on a chip are severed with the aid of a laser beam, so that an item of digital information (interrupted line denotes "0" and continuous line accordingly denotes "1" or vice versa) is used for identifying the value of the output voltage to be set.

In a further embodiment, the DRAM semiconductor memory device includes a charge circuit device for charging the storage capacitors of the further memory cells to a specific voltage. Consequently, the charge circuit device can precharge the storage capacitors of the further memory cells before the precharge operation, so that the voltage VBLEQ of the bit lines BL and /BL that is established via capacitive charge-reversal operations during the precharge operation can be controlled to values that are different from VBLH/2. If the storage capacitors are set to a low level, i.e., 0 V, or just above that before the precharge operation, the voltage VBLEQ will assume values below VBLH/2 after the precharge operation, while the bit lines BL and /BL assume values above VBLH/2 after the precharge operation in the case where the storage capacitors of the further memory cells are precharged to values of VBLH or slightly below the latter.

In a further embodiment, the charge circuit device includes a voltage source, which can be set in terms of its output voltage, for providing the specific voltage. The specific voltage may lie either within the voltage window from 0 V to VBLH or outside this window.

In a further embodiment, the further memory cells are arranged in an edge region of the memory cell array. In the edge region, memory cells usually have poorer memory cell properties on account of microloading effects in comparison with memory cells in the interior of the memory cell array. Since the requirements made of the further memory cells with regard to leakage current, charge retention time, etc. are less stringent in comparison with the memory cells within the memory cell array, memory cells arranged in the edge region are suitable particularly for use as further memory cells.

In a further embodiment, the further memory cells are redundant DRAM memory cells. The redundant DRAM memory cells serve as replacement for nonfunctional memory cells in order to ensure a specified memory capacity of the DRAM. In particular, memory cells in the edge region of the memory cell array may also serve as redundant memory cells.

In a further embodiment, two lines run parallel to a series of adjacent sense amplifiers, a first one of the two lines being suitable for driving the gates of the further memory cells connected to the bit lines BL of the sense amplifiers and a second one of the two lines being suitable for driving the gates of the further memory cells connected to the bit lines /BL. The sense amplifiers that are adjacent in a series and also the two lines may in this case run parallel in particular to word lines of the memory cell array. The two lines are used for the same purpose as the word lines, namely the driving of the gates of selection transistors.

A first embodiment of a method for increasing the reading accuracy of a DRAM memory cell in a memory cell array including memory cells which each include a selection transistor and a storage capacitor and are arranged along bit lines running parallel to one another and word lines running perpendicular thereto, drain regions of the selection transistors connected to the bit lines and gates of the selection transistors connected to the word lines and includes in each case a pair of bit lines BL and /BL connected to a sense amplifier, the method including: providing in each case a further memory cell connected to the bit lines BL and /BL, switching on the gates of the two further memory cells during a precharge operation for charging the bit lines BL and /BL to an equalization voltage VBLEQ, and switching on, during a read operation of a memory cell connected to one bit line of the pair BL and /BL, the gate of that further memory cell which is connected to the other bit line of the pair BL and /BL. Switching on the gate of the further memory cell specified above during the read operation thus including the effect that both bit lines BL and /BL couple capacitively to a switched-on memory cell. While one bit line is connected to the storage capacitor of the memory cell to be read via the switched-on selection transistor of the memory cell, the other one of the bit lines BL and /BL is conductively connected to the storage capacitor of the further memory cell specified above via the selection transistor thereof. Consequently, there is no disequilibrium of the capacitive environment between the two bit lines BL and /BL. The further memory cell which is connected to the same bit line as the memory cell to be read is switched off during the read operation, i.e., the gate of the selection transistor of the memory cell is kept in a switched-off state via a driving circuit device, for example.

A second embodiment of a method for increasing the reading accuracy of a DRAM memory cell in a memory cell array including memory cells, the memory cells each include a selection transistor and a storage capacitor and are arranged along bit lines running parallel to one another and word lines running perpendicular thereto, drain regions of the selection transistors connected to the bit lines and gates of the selection transistors connected to the word lines and in each case a pair of bit lines BL and /BL connected to a sense amplifier, the method including: providing in each case a further memory cell connected to the bit lines BL and /BL, charging the storage capacitors of the further memory cells before a precharge operation to a specific value and switching on the gates of the two further memory cells during the precharge operation of the bit lines BL and /BL to a voltage VBLEQ that is different from half of a bit line high voltage level value VBLH. In this case, the specific voltage is different from VBLH/2, such that an equalization voltage VBLEQ that is different from VBLH/2 is established capacitively during the precharge operation via capacitive charge-reversal between the bit lines BL and /BL and also the storage capacitors of the further memory cells. The two further memory cells remain switched off during the read operation.

In a further embodiment, during the precharge operation, the two bit lines BL and /BL are connected to a VBLEQ voltage source which can be set in terms of its output voltage, and are short-circuited with one another, a resistance of the connection between the VBLEQ voltage source and the two bit lines BL and /BL being a plurality of orders of magnitude greater than the resistance between the short-circuited bit lines. Consequently, the equalization voltage VBLEQ of the bit lines BL and /BL is established essentially via capacitive charge-reversal operations during the precharge operation. If this voltage that is established capacitively matches the output voltage of the variable VBLEQ voltage source, the bit lines BL and /BL are not subjected to further charge reversal via the variable VBLEQ voltage source.

In a further embodiment, the variable VBLEQ voltage source is set to the equalization voltage VBLEQ via a procedure in which first in the test mode of the DRAM, with the VBLEQ voltage source deactivated, the voltage VBLEQ is measured at a equalization VBLEQ pad and the voltage of the VBLEQ voltage source is then set to this value. The voltage of the VBLEQ voltage source thus corresponds to the equalization voltage VBLEQ of the bit lines BL and /BL that is established capacitively during the precharge operation. By virtue of the VBLEQ voltage source being set to this value, the potential of the bit lines BL and /BL that is established capacitively is stabilized with the aid of the VBLEQ voltage source.

In a further embodiment, the variable VBLEQ voltage source is set to the voltage VBLEQ with the aid of laser fuses. Consequently, conductor tracks of the laser fuses are interrupted selectively by laser beam, such that a digital identification corresponding to the voltage VBLEQ is set.

The further memory cells may be selected from memory cells in an edge region of the memory cell array.

The further memory cells may additionally be selected from redundant memory cells. The redundant memory cells may be for example memory cells in the edge region of the memory cell array.

More than one further memory cell may also be provided per bit line, the further memory cells connected to a bit line being driven jointly. Consequently, the further memory cells connected to a bit line are connected in parallel, i.e., the drain regions of their selection transistors are short-circuited. The gates of the selection transistors are likewise short-circuited. The same applies to nodes between the source of the selection transistor and storage capacitor.

In the following paragraphs, exemplary embodiments of the device and/or method are described in connection with the figures.

FIG. 1 illustrates a view of part of a known DRAM circuit arrangement for reading the charge of a storage capacitor. Bit lines BL and /BL running parallel to one another are connected to a sense amplifier 1. A respective memory cell 2 is connected to the bit lines BL and /BL. The memory cells 2 each include a selection transistor 3 connected via its drain to the corresponding bit line, and via its source to an electrode of a storage capacitor 4 of the memory cell 2. Word lines 5 drive the gates of the respective transistor 3. Thereby, producing a conductive connection between the storage capacitor 4 and the corresponding bit line, i.e., in order to write or read charge to or from the storage capacitor 4. By switching on the gate via a gate control signal, it is possible to produce a conductive channel between source and drain of the selection transistor 3 and thus to produce a conductive connection between the bit line and the storage capacitor 4 for reading or writing information. In a known manner, the bit lines BL and /BL are charged to a voltage VBLEQ with the aid of a precharge operation before a read operation, the voltage VBLEQ corresponding to half of a bit line high voltage level value VBLH. The voltage VBLH serves for writing a logic "1" to the storage capacitors 4 of the memory cells 2. Consequently, directly before the driving of the memory cell 2 to be read, the bit lines BL and /BL are at the same potential VBLEQ=VBLH/2. If, for example, the memory cell 2 connected to the bit line BL is then opened, i.e., that the selection transistor is turned on via the gate thereof, so that the storage capacitor 4 is conductively connected to the bit line BL, this leads to a voltage change on the bit line BL on account of the capacitive charge-reversal operations between the storage capacitor 4 and the parasitic capacitance of the bit line BL. This voltage change is detected and amplified relative to the original potential VBLEQ present on the bit line /BL via the sense amplifier. This signal is taken as a basis for determining whether the storage capacitor has stored a logic "0" or a logic "1." The precharge voltage of the bit lines BL and /BL of this known embodiment for reading a memory cell of a DRAM is VBLH/2 and, during the detection of the charge state of the memory cell to be read, the capacitances of the bit lines BL and /BL are different from one another since the memory cell to be read is connected to the corresponding bit line via its storage capacitor, but no capacitive load of a memory cell with a switched-on selection transistor is present on the other bit line. It should be pointed out that the figures merely illustrate a small excerpt from the memory cell array that serves to provide an understanding of the described device. A multiplicity of bit line pairs BL and /BL are present in the memory cell array, however. Likewise, a multiplicity of memory cells 2 are connected to each bit line.

Figure 2:
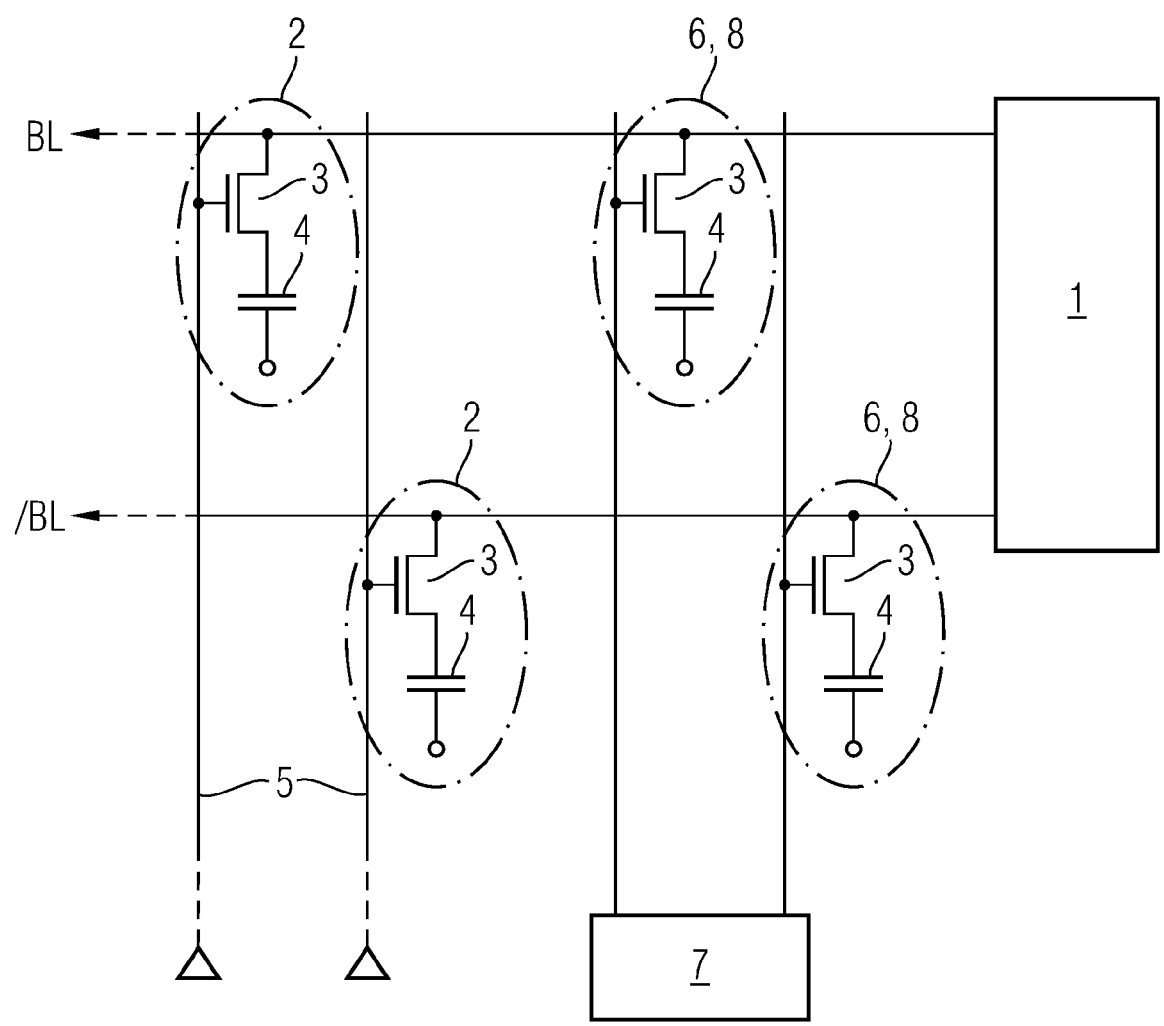
FIG. 2 illustrates a first embodiment of a DRAM with a high reading accuracy.

FIG. 2 shows a view of a first embodiment of a DRAM with a high reading accuracy. In contrast to the known DRAM illustrated in FIG. 1, this embodiment has in each case a further memory cell 6 on the two bit lines BL and /BL. A driving circuit device 7 serves for driving the further memory cells 6. During a precharge operation for precharging the bit lines BL and /BL to an equalization voltage VBLEQ=VBLH/2, the driving circuit device switches on the gates of the further memory cells 6, so that the storage capacitors 4 of the further memory cells 6 are likewise charged to the potential VBLEQ=VBLH/2. Consequently, before the gate of the selection transistor of a memory cell to be read is opened, both the bit lines BL and /BL and the storage capacitors of the further memory cells 6 are at the potential VBLEQ. During the read operation with the gate of the memory cell to be read having been opened, the gate of that further memory cell 6 is likewise switched on, via the driving circuit device 7, which is connected to that bit line which is different from the bit line to which the memory cell to be read is connected. If, for instance, a memory cell 2 connected to the bit line BL is intended to be read, the gate of the further memory cell 6 connected to the bit line /BL is opened via the driving circuit 7, while the gate of the further memory cell 6 connected to the bit line BL remains switched off. If the gate of a memory cell 2 to be read on the bit line BL is then opened during the read operation, a capacitive charge exchange takes place between the storage capacitor 4 of the memory cell to be read and the bit line BL, which leads to a potential difference ΔV with respect to VBLEQ and is detected by the sense amplifier 1. In addition, the total capacitances of the two bit lines BL and /BL match one another since, during the read operation, a respective storage capacitor 4 is connected to the respective bit line via the gate of an associated memory cell 2 (bit line BL) or further memory cell 6 (bit line /BL). Since the storage capacitor 4 of the further memory cell 6 connected to the bit line /BL during the read operation is at VBLEQ potential in the same way as the bit line /BL, this does not impair the potential of the corresponding bit line and hence the read operation. However, it is possible to avoid the capacitive disequilibrium on the two bit lines BL and /BL in the case of the known read operation of a DRAM as illustrated in FIG. 1. The further memory cells 6 thus serve as capacitive equalization cells 8 and increase the reading accuracy.

FIG. 3 illustrates a further embodiment of a DRAM according to the described device with a high reading accuracy. In contrast to the first embodiment, the further memory cells 6 are formed as precharged cells 9 instead of as equalization cells and are driven by a driving circuit 7.' It should be assumed that the storage capacitors 4 of the further memory cells 6, 9 have been precharged to a voltage that is different from VBLH/2 with the aid of a charge circuit device (not illustrated) before the precharge operation. A bit line equalization circuit 10 short-circuits the leads BL and /BL during the precharge operation via an EQL signal and connects the bit lines to a VBLEQ voltage source 11 which can be set in terms of its output voltage. The resistance between the bit lines BL and /BL is small relative to the resistance with respect to the VBLEQ voltage source 11, so that a capacitive charge equalization of the parasitic bit line capacitances defines an equalization voltage of the bit lines. During the precharge operation, the driving circuit device 7' turns on the gates of the further memory cells 6, so that the latter are incorporated into the capacitive charge equalization and contribute to setting the potential VBLEQ on the bit lines BL and /BL. On account of the precharged storage capacitors of the further memory cells 6 and the inclusion thereof in the capacitive charge-reversal operation for equalizing the potentials on the bit lines BL and /BL to VBLEQ, it is possible to establish a potential that is different from VBLH/2. Since, before the precharge operation, one of the bit lines is at VBLH ("1" or high level) and the other one is at VBLL ("0" or low level), it is possible, with storage capacitors of the further memory cells 6 charged to VBLL, for a lower potential relative to VBLH/2 to be established on the bit lines BL and /BL via the precharge operation since the storage capacitors of the further memory cells 6 are charged during the precharge operation. In order to set the voltage VBLEQ that is established capacitively as the output voltage of the VBLEQ voltage source, which, during the precharge operation, leads for instance to a stabilization of the voltage VBLEQ with respect to leakage currents, it is the case that, for example, in a test mode with the VBLEQ voltage source turned off, the voltage VBLEQ that is established capacitively is tapped off metrologically at a VBLEQ pad connected to one of the bit lines BL and /BL and the VBLEQ voltage value determined is set at the VBLEQ voltage source. During the read operation with switched-on gate of the selection transistor 3 of a memory cell to be read, the gates of the further memory cells 6 are switched off via the driving circuit device 7.' In this further embodiment, it is thus possible to obtain an equalization voltage VBLEQ that is different from VBLH/2 on the bit lines BL and /BL during the precharge operation, which in turn leads to an increased reading accuracy.

While the device and corresponding method have been described in detail with reference to specific embodiments thereof, it will be apparent to one of ordinary skill in the art that various changes and modifications can be made therein without departing from the spirit and scope thereof. Accordingly, it is intended that the invention covers modifications and variations of the device and method provided they come within the scope of the appended claims and their equivalents.

What is claimed is:

1. A DRAM semiconductor memory device comprising:
   a plurality of memory cells, each memory cell including a selection transistor and a storage capacitor, the plurality of memory cells being arranged in a memory cell array with bit lines and word lines, wherein a drain region of each selection transistor is connected to a respective bit line and a gate of each selection transistor is connected to a respective word line;
   a plurality of bit lines including at least a pair of first and second bit lines, wherein each of the first and second bit lines includes a memory cell connected to the bit line and a further memory cell connected to the bit line;
   a plurality of sense amplifiers including a sense amplifier being connected to the pair of first and second bit lines; and
   a driving circuit device connected to the gate of each further memory cell connected to the first and second bit lines, wherein the driving circuit is configured to simultaneously switch on the gates of the further memory cells in response to initiating a precharge operation for charging the pair of first and second bit lines to an equalization voltage.

2. The DRAM semiconductor memory device of claim 1, wherein, during a read operation of the memory cell connected to one of the pair of first and second bit lines, the driving circuit device is configured to turn on the gate of the further memory cell that is connected to the other of the pair of first and second bit lines.

3. The DRAM semiconductor memory device of claim 1, further comprising:
   a bit line equalization circuit device that connects a variable voltage source to the pair of first and second bit lines and short-circuits the pair of first and second bit lines during the precharge operation, wherein a resistance of the connection between the voltage source and the pair of first and second bit lines is a plurality of orders of magnitude greater than the resistance between the short-circuited pair of first and second bit lines.

4. The DRAM semiconductor memory device of claim 3, wherein the variable voltage source comprises laser fuses to set an output voltage.

5. The DRAM semiconductor memory device of claim 4, further comprising:
   a charge circuit device that charges the storage capacitors of the further memory cells to a specific voltage.

6. The DRAM semiconductor memory device of claim 5, wherein the charge circuit device includes a variable voltage source to provide the specific voltage.

7. The DRAM semiconductor memory device of claim 1, wherein the further memory cells are arranged in an edge region of the memory cell array.

8. The DRAM semiconductor memory device of claim 1, wherein the further memory cells comprise redundant DRAM memory cells.

9. The DRAM semiconductor memory device of claim 1, further comprising:
   two lines running parallel to adjacent sense amplifiers, wherein one of the two lines drives the gate of the further memory cell connected to the first bit line and the other of the two lines drives the gate of the further memory cell connected to the second bit line.

10. An electric device comprising the DRAM semiconductor device of claim 1.

11. A method for increasing the reading accuracy of a DRAM memory cell comprising:
    providing a memory cell array that comprises bit lines, word lines, memory cells, with each memory cell including a selection transistor and a storage capacitor, the drain regions of the selection transistors being connected to the bit lines and the gates of the selection transistors being connected to the word lines, and a plurality of sense amplifiers connected to respective pairs of bit lines, where each pair of bit lines includes a first bit line and a second bit line, with a memory cell and a further memory cell being connected to each of the first and second bit lines of each pair of bit lines;
    charging the storage capacitors of the further memory cells prior to a precharge operation of the pairs of bit lines; and
    switching on the gates of the further memory cells connected to a selected pair of first and second bit lines in response to a precharge operation for charging the first and second bit lines of the selected pair to an equalization voltage that is different from half of a bit line high voltage level value.

12. The method of claim 11, wherein, during the precharge operation, the first and second bit lines of the selected pair are connected to a variable voltage source to set an output voltage, and the first and second bit lines of the selected pair are short-circuited with one another, such that a resistance of the connection between the variable voltage source and the first and second bit lines of the selected pair is a plurality of orders of magnitude greater than the resistance between the short-circuited first and second bit lines of the selected pair.

13. The method of claim 12, wherein, during a test mode of the DRAM in which the variable voltage source is deactivated, the variable voltage source is set to the equalization voltage by measuring the equalization voltage at an equalization voltage pad, and the variable voltage source is set to the measured equalization voltage.

14. The method of claim 12, wherein the variable voltage source is set to the equalization voltage via laser fuses.

15. The method of claim 11, wherein the further memory cells are selected from memory cells in an edge region of the memory cell array.

16. The method of claim 11, wherein the further memory cells comprise redundant memory cells.

17. The method of claim 11, wherein a plurality of further memory cells are connected to each bit line, and the further memory cells connected to each bit line are jointly driven.

18. A method for increasing the reading accuracy of a DRAM memory cell in a memory cell array comprising:
    providing a memory cell array that comprises bit lines, word lines, memory cells, with each memory cell including a selection transistor and a storage capacitor, the drain regions of the selection transistors being connected to the bit lines and the gates of the selection transistors being connected to the word lines, and a plurality of sense amplifiers connected to respective pairs of bit lines, where each pair of bit lines includes a first bit line and a second bit line, with a memory cell and a further memory cell being connected to each of the first and second bit lines of each pair of bit lines;

switching on the gates of the further memory cells connected to a selected pair of first and second bit lines in response to a precharge operation for charging the first and second bit lines of the selected pair to an equalization voltage; and in response to a read operation of a memory cell connected to the first bit line of the selected pair of first and second bit lines, switching on the gate of the further memory cell connected to the second bit line of the selected pair of first and second bit lines.

19. The method of claim 18, wherein the further memory cells comprise memory cells located in an edge region of the memory cell array.

20. The method of claim 18, wherein the further memory cells comprise redundant memory cells.

21. The method of claim 18, wherein a plurality of further memory cells are connected to each bit line, and the further memory cells connected to each bit line are jointly driven.

* * * * *